US008529680B2

(12) United States Patent
De Rege Thesauro et al.

(10) Patent No.: US 8,529,680 B2
(45) Date of Patent: *Sep. 10, 2013

(54) COMPOSITIONS FOR CMP OF SEMICONDUCTOR MATERIALS

(75) Inventors: Francesco De Rege Thesauro, Naperville, IL (US); Steven Grumbine, Aurora, IL (US); Phillip Carter, Lake Bluff, IL (US); Shoutian Li, Naperville, IL (US); Jian Zhang, Pleasanton, CA (US); David Schroeder, Aurora, IL (US); Ming-Shih Tsai, Hsinchu (TW)

(73) Assignee: Cabot Microelectronics Corporation, Aurora, IL (US)

( * ) Notice: Subject to any disclaimer, the term of this patent is extended or adjusted under 35 U.S.C. 154(b) by 86 days.

This patent is subject to a terminal disclaimer.

(21) Appl. No.: 12/854,470

(22) Filed: Aug. 11, 2010

(65) Prior Publication Data

US 2010/0314576 A1 Dec. 16, 2010

Related U.S. Application Data

(60) Division of application No. 11/673,399, filed on Feb. 9, 2007, now Pat. No. 7,803,203, which is a continuation-in-part of application No. 11/235,765, filed on Sep. 26, 2005, now Pat. No. 7,316,603.

(60) Provisional application No. 60/841,005, filed on Aug. 30, 2006.

(51) Int. Cl.
| | |
|---|---|
| C09G 1/02 | (2006.01) |
| B24D 3/02 | (2006.01) |
| C09C 1/68 | (2006.01) |
| C09K 3/14 | (2006.01) |

(52) U.S. Cl.
USPC .............. 106/3; 51/307; 51/308; 51/309

(58) Field of Classification Search
USPC ...................... 106/3; 51/307–309
See application file for complete search history.

(56) References Cited

U.S. PATENT DOCUMENTS

| | | |
|---|---|---|
| 4,671,851 A | 6/1987 | Beyer et al. |
| 4,789,648 A | 12/1988 | Chow et al. |
| 4,910,155 A | 3/1990 | Cote et al. |
| 4,944,836 A | 7/1990 | Beyer et al. |
| 5,044,128 A | 9/1991 | Nakano |
| 5,489,233 A | 2/1996 | Cook et al. |
| 5,527,423 A | 6/1996 | Neville et al. |
| 5,626,715 A | 5/1997 | Rostoker |
| 5,691,219 A | 11/1997 | Kawakubo et al. |
| 5,693,239 A | 12/1997 | Wang et al. |
| 5,709,588 A | 1/1998 | Muroyama |
| 5,868,604 A | 2/1999 | Atsugi et al. |
| 5,916,855 A | 6/1999 | Avanzino et al. |
| 5,958,288 A | 9/1999 | Mueller et al. |
| 5,958,794 A | 9/1999 | Bruxvoort et al. |
| 6,001,269 A | 12/1999 | Sethuraman et al. |
| 6,063,306 A | 5/2000 | Kaufman et al. |
| 6,083,838 A | 7/2000 | Burton et al. |
| 6,093,649 A | 7/2000 | Roberts et al. |
| 6,117,783 A | 9/2000 | Small et al. |
| 6,126,853 A | 10/2000 | Kaufman et al. |
| 6,146,244 A | 11/2000 | Atsugi et al. |
| 6,274,063 B1 | 8/2001 | Li et al. |
| 6,290,736 B1 | 9/2001 | Evans |
| 6,293,848 B1 | 9/2001 | Fang et al. |
| 6,312,321 B1 | 11/2001 | Fukushima et al. |
| 6,313,039 B1 | 11/2001 | Small et al. |
| 6,416,685 B1 | 7/2002 | Zhang et al. |
| 6,527,622 B1 | 3/2003 | Brusic et al. |
| 6,551,935 B1 | 4/2003 | Sinha et al. |
| 6,569,215 B2 | 5/2003 | Miyata |
| 6,623,355 B2 | 9/2003 | McClain et al. |
| 6,635,186 B1 | 10/2003 | Small et al. |
| 6,705,926 B2 | 3/2004 | Zhou et al. |
| 6,722,942 B1 | 4/2004 | Lansford et al. |
| 6,734,423 B2 | 5/2004 | Bryden |
| 6,736,992 B2 | 5/2004 | Zhang et al. |
| 7,019,138 B2 | 3/2006 | Elliott et al. |
| 7,029,508 B2 | 4/2006 | Scott et al. |
| 7,033,942 B2 | 4/2006 | Small et al. |
| 7,081,210 B2 | 7/2006 | Hirai et al. |
| 7,097,541 B2 | 8/2006 | DeRege Thesauro et al. |
| 7,316,603 B2 * | 1/2008 | Carter et al. ............... 451/56 |
| 2001/0049913 A1 | 12/2001 | Miyata |
| 2002/0039839 A1 | 4/2002 | Thomas et al. |
| 2003/0006369 A1 | 1/2003 | Bryden |
| 2003/0181142 A1 * | 9/2003 | De Rege Thesauro et al. . 451/36 |
| 2004/0175941 A1 | 9/2004 | Zhang et al. |
| 2004/0267018 A1 | 12/2004 | Elliott et al. |
| 2005/0070211 A1 | 3/2005 | Bian |
| 2005/0148179 A1 | 7/2005 | Hirai et al. |
| 2006/0030158 A1 | 2/2006 | Carter et al. |

FOREIGN PATENT DOCUMENTS

| | | |
|---|---|---|
| EP | 0970156 | 1/2000 |
| JP | 1-270512 | 10/1989 |
| JP | 11-121411 | 4/1999 |
| JP | 2002-270549 | * 9/2002 |
| WO | WO98/42790 | 10/1998 |
| WO | WO 00/77107 | 12/2000 |
| WO | WO 01/44396 | 6/2001 |
| WO | WO 2004/044075 | 5/2004 |
| WO | WO 2004/069947 | 8/2004 |

OTHER PUBLICATIONS

Fultz et al., "Mediator Compounds for the Electrochemical Study of Biological Redox Systems: A Compilation," *Analytica Chimica Acta*, 140: 1-18 (1982).

* cited by examiner

*Primary Examiner* — Shuangyi Abu Ali
(74) *Attorney, Agent, or Firm* — Thomas E Omholt; Steven D Weseman

(57) ABSTRACT

The invention provides a composition for chemical-mechanical polishing. The composition comprises an abrasive, a first metal rate polishing modifier agent, a second metal rate polishing modifier agent, and a liquid carrier. In one embodiment, the first metal rate polishing modifier agent has a standard reduction potential less than 0.34 V relative to a standard hydrogen electrode, and the second metal rate polishing modifier agent has a standard reduction potential greater than 0.34 V relative to a standard hydrogen electrode. In other embodiments, the first and second metal rate polishing modifier agents are different oxidizing agents.

25 Claims, No Drawings

COMPOSITIONS FOR CMP OF SEMICONDUCTOR MATERIALS

CROSS-REFERENCE TO RELATED APPLICATIONS

This patent application is a divisional application of U.S. patent application Ser. No. 11/673,399, filed Feb. 9, 2007, now U.S. Pat. No. 7,803,203, which is a continuation-in-part of U.S. patent application Ser. No. 11/235,765, now U.S. Pat. No. 7,316,603 filed Sep. 26, 2005, and claims priority to U.S. Provisional Application No. 60/841,005, filed Aug. 30, 2006.

FIELD OF THE INVENTION

This invention relates to polishing compositions and methods for polishing a substrate using the same. More particularly, this invention relates to chemical-mechanical polishing compositions suitable for polishing semiconductor surfaces.

BACKGROUND OF THE INVENTION

Compositions and methods for chemical-mechanical polishing (CMP) of the surface of a substrate are well known in the art. Polishing compositions (also known as polishing slurries, CMP slurries, and CMP compositions) for CMP of metal-containing surfaces of semiconductor substrates (e.g., integrated circuits) typically contain an abrasive, various additive compounds, and the like.

In general, CMP involves the concurrent chemical and mechanical polishing of an overlying first layer to expose a portion of the surface of a non-planar second layer on which the first layer is formed. For example, U.S. Pat. No. 4,789,648 discloses a CMP process using a polishing pad and a polishing composition to remove a first layer at a faster rate than a second layer until the surface of the overlying first layer of material becomes coplanar with the upper surface of the covered second layer. A more detailed explanation of chemical-mechanical polishing can be found in U.S. Pat. Nos. 4,671,851, 4,910,155 and 4,944,836.

Manufacturers of integrated circuits strive to improve the current density of semiconductor devices. It has become necessary to use conductive materials having low resistivity for conductors in feature definitions formed in materials having low dielectric constants as insulating layers to reduce the capacitive coupling between adjacent interconnects. A conductive material fitting these requirements is copper and alloys thereof.

One difficulty in using copper (Cu) in semiconductor devices is that copper diffuses into surrounding insulator material. To reduce the copper diffusion into the insulator material, and to aid in the adhesion of copper, a barrier layer is deposited in feature definitions prior to copper deposition. Barrier materials include, for example, tantalum (Ta), tantalum nitride (TaN), titanium (Ti), and titanium nitride (TiN). Following copper deposition, the excess copper and barrier layer is removed using. CMP.

Current CMP processes and commercially available slurries for barrier layer removal are limited as to the useful chemical composition of the slurry because of the relatively inert nature of Ta. Consequently, polishing relies predominantly on strong mechanical abrasion. Stated somewhat differently, the currently available'CMP processes and compositions with high solids concentrations for workpieces with Ta-containing barrier layers have very poor selectivity among the barrier layer, metal layer (Cu-based), and the interlayer dielectric (ILD) layer (silicon oxide-based), resulting in excessive concurrent removal of the metal and ILD layers.

Another approach to polishing multiple metals in a substrate is to use a large amount of oxidizer sufficient to oxidize all the metals to be polished on the substrate. The removal rates of the metals are then controlled by the use of additives which passivate a metal surface or complex a metal ion. This approach requires optimizing the passivation film chemistry to slow down the oxidation of one metal and allow the removal of a second metal on the substrate.

Many of the known CMP compositions are suitable for limited purposes but also suffer from unacceptable polishing performance. Thus, there remains an ongoing need for new CMP compositions that exhibit useful removal rates for semiconductor materials such as tantalum when present with a second metal.

BRIEF SUMMARY OF THE INVENTION

The invention provides a chemical-mechanical polishing composition comprising (a) an abrasive, (b) a first metal polishing rate modifier agent, (c) a second metal polishing rate modifier agent, and (d) a liquid carrier.

In one embodiment, the first metal polishing rate modifier agent has a standard reduction potential less than 0.34 V relative to a standard hydrogen electrode, wherein the first metal polishing rate modifier agent is a quinone, and the second metal polishing rate modifier agent has a standard reduction potential greater than 0.34 V relative to a standard hydrogen electrode.

In a second embodiment, the first metal polishing rate modifier agent is an organic oxidizing agent comprising a quinone moiety, and the second metal polishing rate modifier agent is selected from the group consisting of iodide, iodine, $I_2 \cdot malonamide_3$, and triiodide.

In a third embodiment, the first metal polishing rate modifier agent is an organic oxidizing agent comprising a quinone moiety, and the second metal polishing rate modifier agent is an oxidizing agent present in a concentration below the concentration of the first metal polishing rate modifier agent.

In a fourth embodiment, the first metal polishing rate modifier agent is an organic oxidizing agent comprising a quinone moiety, with the proviso that the first metal polishing rate modifier is not 1,2-napthoquinone-4-sulfonic acid, aminoanthraquinone sulfonic acid, or hydroquinone sulfonic acid, and the second metal polishing rate modifier agent is an oxidizing agent, with the proviso that the second metal polishing rate, modifier agent is not the same as the first metal polishing rate modifier agent and is not potassium iodate or nitric acid.

The invention also provides a method of chemically-mechanically polishing a substrate, which method comprises (i) providing a substrate, desirably with at least two metals, (ii) providing one of the aforesaid chemical-mechanical polishing compositions, (iii) contacting the substrate with a polishing pad with the polishing composition therebetween, (iv) moving the polishing pad and polishing composition relative to the substrate, and (iv) abrading at least a portion of the substrate to polish the substrate.

DETAILED DESCRIPTION OF THE INVENTION

The invention provides a CMP composition useful for polishing a substrate, preferably a semiconductor substrate that desirably contains at least two metals. The CMP composition contains (a) an abrasive, (b) a first metal polishing rate modifier agent, (c) a second metal polishing rate modifier agent, and (d) a liquid carrier.

The CMP composition desirably provides for even, rapid removal of one or more metals in a substrate relative to conventional CMP compositions. In addition, the CMP composition can be utilized in a manner in which the selectivity for removal of copper and tantalum, and optionally TiN, can be varied by the user.

The abrasive can be any suitable abrasive, especially an abrasive suitable for use in CMP of semiconductor materials. The abrasive desirably comprises, consists essentially of, or consists of a metal oxide. Examples of suitable abrasives include, without limitation silica, alumina, titania, ceria, zirconia, or a combination of two or more of the foregoing abrasives. The abrasive preferably is silica or alumina, most preferably silica (e.g., amorphous silica, colloidal silica, or colloidal silica doped with aluminum).

The abrasive can be present in the CMP composition in any suitable amount. For example, the abrasive can be present in the CMP composition in an amount of about 0.1 wt. % or more, e.g., 0.2 wt. % or more, 0.5 wt. % or more, or about 1 wt. % or more. Alternatively, or in addition, the abrasive can be present in the CMP composition in an amount of about 20 wt. % or less, e.g., about 15 wt. % or less, about 12 wt. % or less, about 10 wt. % or less, about 8 wt. % or less, about 5 wt. % or less, about 4 wt. % or less, or about 3 wt. % or less. Thus, the abrasive can be present in the CMP composition in an amount of about 0.1 wt. % to about 20 wt. %, e.g., about 0.1 wt. % to about 12 wt. %, or about 0.1 wt. % to 4 wt. %.

The abrasive can be in any suitable form. Typically, the abrasive is in the form of particles, which can be of any suitable size (i.e., the diameter of the smallest sphere encompassing the particle). For example, the abrasive can have a mean particle size of about 10 nm or more; e.g., about 20 nm or more, about 30 nm or more, or about 50 nm or more. Alternatively, or in addition, the abrasive can have a mean particle size of about 500 nm or less, e.g., about 300 nm or less, about 200 nm or less, or about 100 nm or less. Particle size can be determined by any suitable method, many of which are well known in the art, such as laser light scattering techniques.

The abrasive desirably is suspended in the CMP composition, more specifically in the liquid carrier of the CMP composition. When the abrasive is suspended in the CMP composition, the abrasive preferably is colloidally stable. The term "Colloid" refers to the suspension of abrasive particles in the liquid carrier. "Colloidal stability" refers to the maintenance of that suspension over time. In the context of this invention, an abrasive is considered colloidally stable in a CMP composition if, when the CMP composition is placed into a 100 ml graduated cylinder and allowed to stand without agitation for a time of 2 hours, the difference between the concentration of abrasive in the bottom 50 ml of the graduated cylinder ([B] in terms of g/ml) and the concentration of abrasive in the top 50 ml of the graduated cylinder ([T] in terms of g/ml) divided by the initial concentration of abrasive in the CMP composition ([C] in terms of g/ml) is less than or equal to 0.5 (i.e., $\{[B]-[T]\}/[C] \leq 0.5$). The value of $[B]-[T]/[C]$ desirably is less than or equal to 0.3, and preferably is less than or equal to 0.1.

The first and second metal polishing rate modifier agents are selected from the following pairs of first and second metal polishing rate modifier agents: (1) the first metal polishing rate modifier agent has a standard reduction potential less than 0.34 V relative to a standard hydrogen electrode, wherein the first metal polishing rate modifier agent is a quinone, and the second metal polishing rate modifier agent has a standard reduction potential greater than 0.34 V relative to a standard hydrogen electrode, (2) the first metal polishing rate modifier agent is an organic oxidizing agent comprising a quinone moiety, and the second metal polishing rate modifier agent is selected from the group consisting of iodide, iodine, $I_2 \cdot malonamide_3$, and triiodide, (3) the first metal polishing rate modifier agent is an organic oxidizing agent comprising a quinone moiety, and the second metal polishing rate modifier agent is an oxidizing agent present in a concentration below the concentration of the first metal polishing rate modifier agent, and (4) the first metal polishing rate modifier agent is an organic oxidizing agent comprising a quinone moiety, with the proviso that the first metal polishing rate modifier is not 1,2-napthoquinone-4-sulfonic acid, aminoanthraquinone sulfonic acid, or hydroquinone sulfonic acid, and the second metal polishing rate modifier agent is an oxidizing agent, with the proviso that the second metal polishing rate modifier agent is not the same as the first metal polishing rate modifier agent and is not potassium iodate or nitric acid.

In the first embodiment, the first metal polishing rate modifier agent can be any suitable material having a standard reduction potential of about 0.34 V (the E° value for $Cu^{2+} \rightarrow Cu^0$) or less relative to a standard hydrogen electrode. The second metal polishing rate modifier agent in the first embodiment can be any suitable material having a standard reduction potential greater than 0.34 V relative to a standard hydrogen electrode.

In the second embodiment, the first metal polishing rate modifier agent can be any suitable organic oxidizing agent comprising a quinone moiety. The second metal polishing rate modifier agent in the second embodiment can be any suitable agent selected from the group consisting of iodide, iodine, $I_2 \cdot malonamide_3$, and triiodide. The CMP composition of the second embodiment can optionally further comprise a second oxidizing agent.

In the third embodiment, the first metal polishing rate modifier agent can be any suitable organic oxidizing agent comprising a quinone moiety. The second metal polishing rate modifier agent in the third embodiment can be any suitable oxidizing agent present in a concentration below the concentration of the first metal polishing rate modifier agent.

In the fourth embodiment, the first metal polishing rate modifier agent can be any suitable organic oxidizing agent comprising a quinone moiety, with the proviso that the first metal polishing rate modifier is not 1,2-napthoquinone-4-sulfonic acid, aminoanthraquinone sulfonic acid, or hydroquinone sulfonic acid. The second metal polishing rate modifier agent in the fourth embodiment can be any suitable oxidizing agent, with the proviso that the second metal polishing rate modifier agent is not the same as the first metal polishing rate modifier agent and is not potassium iodate or nitric acid.

Suitable organic oxidizing agents include, without limitation, chloranilic acid, organic peroxides, (e.g., t-butyl peroxide), n-methylmorpholine-N-oxide, dichloroindophenol, $I_2 \cdot malonamide_3$, and quinones, such as dihydroxyquinones, e.g., (2,5-dihydroxybenzoquinone), naphthoquinones (e.g., 1,2-naphthoquinone-4-sulfonic acid), and anthraquinones with one or more functional groups. The functional groups of anthraquinones primarily aid in enhancing the solubility of the anthraquinone in the CMP composition but also can affect the performance of the CMP composition in polishing a substrate. Suitable functional groups are, without limitation, sulfonates, phosphates, and amines. The anthraquinones can have a mixture of two or more different types of functional groups. Preferred functional groups for the anthraquinones are sulfonic acids. Thus, the organic oxidizing agent preferably is an anthraquinone disulfonic acid, such as 9,10-anthraquinone-1,8-disulfonic acid, 9,10-anthraquinone-1,5-disulfonic acid, 9,10-anthraquinone-2,6-disulfonic acid, and salts thereof.

Suitable inorganic oxidizing agents include, without limitation, hydrogen peroxide, potassium peroxymonosulfate, persulfate salts (e.g., ammonium monopersulfate, ammonium dipersulfate, potassium monopersulfate, and potassium dipersulfate), periodate salts, (e.g., potassium periodate), perchlorate salts (e.g., potassium perchlorate), iodate salts (e.g., potassium iodate), iodine, triiodate salts, potassium permanganate, inorganic salts of iron (III) (e.g., ferric nitrate), organic salts of iron (III) (e.g., iron (III) malonate [Fe(III)(Ma)$_3$]), cerium (IV) sulfate, bromate salts (e.g., potassium bromate), and chlorate salts. Preferably, when the second metal polishing rate modifier agent is an inorganic oxidizer, it is selected from iodate salts (e.g., potassium iodate), iodine, potassium permanganate, inorganic salts of iron (III) (e.g., ferric nitrate), bromate and chlorate salts, and persulfate salts. In some embodiments, the inorganic metal polishing rate modifier agent is not nitric acid.

The CMP composition can further comprise halide anions. Suitable halide anions include chloride, bromide, and iodide. A preferred halide anion in the CMP composition is iodide. The halide anion can be supplied by the use of any suitable salt in the CMP composition. Suitable salts for supplying halide ions include, for example, potassium, cesium; ammonium, magnesium, calcium, strontium, barium, and aluminum salts.

In addition to iodide, in some embodiments the CMP composition can contain iodine, $I_2$.malonamide$_3$, or triiodide. Iodine can be present as molecular iodine ($I_2$) or as a soluble iodine adduct. Soluble iodine adducts are produced, for example, by combining $I_2$ with a carbon acid. Preferably, the iodine adduct is $I_2$.malonamide$_3$.

The first and second metal polishing rate modifier agents can be present in the CMP composition in any suitable amounts. For example, on a weight basis calculated on the total weight of the CMP composition, each of the first and second metal polishing rate modifier agents can be present in the CMP composition in an amount of about 0.001 wt. % or more, e.g., about 0.01 wt. % or more, about 0.05 wt. % or more, or about 0.1 wt. % or more. Alternatively, or in addition, each of the first and second metal polishing rate modifier agents can be present in the CMP composition in an amount of about 5 wt. % or less, e.g., about 1 wt. % or less, or about 0.5 wt. % or less. On a molar basis, each of the first and second metal polishing rate modifier agents can be present in the CMP composition at a concentration of about 1 mM or more, e.g., about 2 mM or more, about 3 mM or more, or about 5 mM or more. Alternatively, or in addition, each of the first and second metal polishing rate modifier agents can be present in the CMP composition in an amount of about 60 mM or less, e.g., about 40 mM or less, about 20 mM or less, or about 10 mM or less. The second metal polishing rate modifier agent may be present in any concentration; greater than, equal to, or less than the first metal polishing rate modifier agent. For example, in one embodiment, the concentration of the second metal polishing rate modifier agent in the CMP composition is lower than the concentration of the first metal polishing rate modifier agent in the CMP composition.

When the CMP composition comprises a halide, the halide anion can be present in the CMP composition in any suitable concentration. For example, the halide ion can be present in the CMP composition in a concentration of about 5 ppm or more, e.g., about 10 ppm or more, or about 25 ppm or more. Alternatively, or in addition, the halide ion can be present in the CMP composition in a concentration of about 120 ppm or less, e.g., about 100 ppm or less, or about 60 ppm or less.

The liquid carrier can be any suitable liquid carrier. Without limitation, examples of suitable liquid carriers include water, or water miscible solvents such as ethanol, methanol, isopropanol, butanol, and combinations thereof. The liquid carrier is used to facilitate the application of the abrasive particles, the oxidizers and any other additives to the surface of a suitable substrate. Preferably, the liquid carrier is water. Preferably, the water is deionized water.

The CMP composition optionally further comprises suitable amounts of one or more other materials. Such other materials can be other materials commonly included in CMP compositions. For example, such other materials can be corrosion inhibitors, viscosity modifying agents, surfactants, biocides, and the like.

The corrosion inhibitor (i.e., a film-forming agent) can be any suitable corrosion inhibitor. Typically, the corrosion inhibitor is an organic compound containing a heteroatom-containing functional group. For example, the corrosion inhibitor can be a heterocyclic organic compound with at least one 5- or 6-member heterocyclic ring as the active functional group, wherein the heterocyclic ring contains at least one nitrogen atom. Preferably, the corrosion inhibitor is selected from the group consisting of 1,2,3-triazole, 1,2,4-triazole, benzotriazole, benzimidazole, benzothiazole, and mixtures thereof. Most preferably, the composition comprises benzotriazole. The CMP composition can comprise any suitable amount of a corrosion inhibitor.

The biocide can be any suitable biocide. A suitable biocide is an isothiazolinone composition such as KATHON® biocide, which is available from Rohm and Haas (Philadelphia, Pa.). The CMP composition can comprise any suitable amount of a biocide, e.g., typically a biocidal amount.

The CMP composition can have any suitable pH. Preferably, the CMP composition has a pH in the range of about 1 to about 4, e.g., about 2 to about 3. The CMP composition optionally comprises one or more pH adjusting materials, for example, an acid such as nitric acid, hydrochloric acid, acetic acid, and the like, a base such as ammonia, potassium hydroxide, and the like, or a combination thereof, in addition to the other acidic and basic components of the CMP composition.

The CMP composition can be prepared by any suitable technique, many of which are known to those skilled in the art. The CMP composition can be prepared in a batch or continuous process. Generally, the CMP composition can be prepared by combining the components thereof in any order. The terms "component" as used herein includes individual ingredients (e.g., abrasives, acids, bases, metal polishing rate modifier agents, and the like), as well as any combination of ingredients. For example, an abrasive can be dispersed in water, and the metal polishing rate modifier agent, or the acid or base can be added, and mixed by any method that is capable of incorporating the components into the CMP composition. When oxidizing agents are added, some or all of the oxidizing agents may be added just prior to the initiation of polishing of the substrate. The components can be combined on the polishing platen by two or more delivery systems.

The CMP composition can be prepared as separate components that are mixed prior to use. The separate components can be combined in various ways. For example, a three part system can be made wherein the first part (part 1) contains the abrasive particles, the second part (part 2) contains the metal polishing rate modifier agents and water, and the third part (part 3) is water. As a further example, part 1 could comprise about 4 to 30 wt. % silica adjusted to a pH between 2 and 4, and part 2 could comprise two or more suitable metal polishing rate modifier agents. The three parts then could be combined in various ways, for example by adding part 2 to part 3 (water) followed by adding part 1 into the mixture of parts 2 and 3. A skilled practitioner will recognize that the proportions and concentrations of the various parts can vary, depending on solubilities and stabilities of the components, such that the final concentrations of the components of the prepared CMP composition would be as described herein. An advantage of preparing the CMP composition from separate parts is to extend the shelf life of the product by keeping separate the abrasive particles from the other components. Another advantage is that most of the water need not be shipped from the manufacturer to the substrate fabrication facility, but could be added at the location where the polishing will occur, thereby reducing shipping costs.

The invention also provides a method of chemical-mechanical polishing of a substrate, especially a semiconductor substrate. The method comprises (i) contacting a surface of a substrate with a polishing pad and a CMP composition as described herein, and (ii) moving the polishing pad relative to the surface of the substrate with the polishing composition therebetween, thereby abrading at least a portion of the surface to polish the substrate.

The chemical-mechanical polishing method can be used to polish any suitable substrate, and is especially useful for polishing substrates comprising copper, copper-based alloys, tantalum, tantalum nitride, or combinations thereof. The invention also provides a method for selecting relative removal rates of these metals in chemical-mechanical polishing of a substrate. The method comprises altering the concentration of one or more of the metal polishing rate modifier agents such that the removal rate of a first metal is increased or decreased relative to the removal rate of a second metal. For example, increasing the concentration of a metal polishing rate modifier agent in a composition may increase the removal rate of copper and have no effect on the removal rate of tantalum. Therefore, in applications where it is desirable to remove only a small amount of copper relative to tantalum, a lower concentration of the second metal polishing rate modifier agent may be used. Conversely, in applications where it is desirable to remove equal amounts of copper and tantalum, a high concentration of the second metal polishing rate modifier agent may be used. In addition, the concentration and combination of the metal polishing rate modifier agents can be altered to effectively polish TiN.

The CMP method of the invention is particularly suited for use in conjunction with a chemical-mechanical polishing apparatus. Different types of CMP apparatuses for chemical-mechanical polishing are well known in the art. Typically, the CMP apparatus comprises a platen, which, when in use, is in motion and has a velocity that results from orbital, linear, and/or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and a CMP composition described herein and then moving the polishing pad relative to the substrate, so as to abrade at least a portion of the substrate to polish the substrate.

A substrate can be planarized or polished with a CMP composition as described herein using any suitable polishing pad (e.g., polishing surface). Suitable polishing pads include, for example, woven and non-woven polishing pads, grooved or non-grooved pads, porous or non-porous pads, and the like. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Desirably, the polishing pads useful in the CMP method are pads comprising polyurethane polymers.

The polishing pad can be a hard or soft pad. Polishing of substrates comprising barrier materials, such as tantalum, on hard pads is often avoided because of the resulting high defectivity due to mechanical factors, such as scratching and delamination. However it is often desirable to polish using a hard pad because hard pads last longer, thereby lowering the overall cost of the process. The CMP composition of the invention may be used with hard pads and has shown exceptional performance with respect to low defectivity when used with hard pads.

The CMP composition of the invention may be diluted at the point of use. In other words, the CMP composition of the invention may be diluted at the location of the chemical-mechanical polishing, e.g., at the substrate-polishing pad interface. Any suitable dilution can be used.—Dilution is done by adding an appropriate amount of a suitable liquid carrier, typically an aqueous diluent, with adequate mixing, to a concentrate of the CMP composition. The liquid carrier typically is water, preferably distilled or deionized water. In such an embodiment, the CMP composition concentrate can include the various components dispersed or dissolved in the liquid carrier, e.g., an aqueous solvent such as water, in amounts such that, upon dilution of the CMP composition concentrate with an appropriate amount of liquid carrier, e.g., aqueous solvent, each component of the CMP composition will be present in the CMP composition in an amount within the appropriate range for use.

As used herein in reference to the composition and method of the invention, the term tunable refers to the ability to affect a polishing rate of a substrate component by adjusting the concentration of one or more components of the CMP composition. For example, by adjusting the concentration of one of the metal polishing rate modifier agents in a CMP composition of the invention, the tantalum polishing rate can be tuned from rates of 0 to 2000 Å/min, the copper polishing rate can be tuned from 0 to 8000 Å/min, and the TiN polishing rate can be tuned from 0 to about 1500 Å/min. The CMP composition of the invention is tunable to one, two, or more metals present in a substrate. The tunability of the CMP composition provides greater polishing precision of the substrates and greater flexibility for polishing multiple substrates during manufacturing.

The following examples further illustrate the invention but, of course, should not be construed as in any way limiting its scope.

Example 1

This example demonstrates the effectiveness of dual metal polishing rate modifier agents, using 9,10-anthraquinone-1,8-disulfonic acid (1,8-AQDSA) as a first metal polishing rate modifier agent and hydrogen peroxide as a second metal polishing rate modifier agent, in polishing substrates containing tantalum and copper.

Similar substrates comprising tantalum and copper were polished on a Logitech tabletop polisher with an EPIC™ D100 pad (Cabot Microelectronics, Aurora, Ill.) with different polishing compositions (Polishing Compositions 1A-1E). The tool conditions were 102 rpm platen speed, 110 rpm carrier speed, 24.7 kPa (3.58 psi) down force, and 100 mL/min polishing composition flow.

Each of the polishing compositions contained 4 wt. % colloidal silica and 0.08 wt. % of the potassium salt of 1,8-AQDSA and were adjusted to pH 2.2 using nitric acid. Polishing Composition 1A (comparative) did not contain a second metal polishing rate modifier agent. Polishing Compositions 1B, 1C, 1D, and 1E (invention) contained 25 ppm, 50 ppm, 100 ppm, and 500 ppm of hydrogen peroxide, respectively.

The removal rates (RR) for copper for each of the chemical-mechanical polishing compositions were determined, and the results are summarized in Table 1 as averages of multiple polishing experiments.

TABLE 1

Copper Removal Rates with 1,8-AQDSA and $H_2O_2$

| Polishing Composition | $H_2O_2$ (ppm) | $H_2O_2$ (mM) | Cu RR (Å/min) |
|---|---|---|---|
| 1A (comparative) | 0 | 0.0 | 134 |
| 1B (invention) | 25 | 0.7 | 230 |
| 1C (invention) | 50 | 1.5 | 326 |
| 1D (invention) | 100 | 2.9 | 721 |
| 1E (invention) | 500 | 14.7 | 2562 |

The results indicate that increasing the hydrogen peroxide concentration from 0 to about 15 mM increases the Cu removal rate from about 100 to 2500 Å/min.

Example 2

This example demonstrates the effectiveness of dual metal polishing rate modifier agents, using 1,8-AQDSA as a first metal polishing rate modifier agent and potassium iodate as a second metal polishing rate modifier agent, in polishing substrates containing tantalum and copper.

Similar substrates comprising tantalum and copper were polished on a Logitech tabletop polisher with an IC1000 polishing pad with different polishing compositions (Polishing Compositions 2A-2C). The tool conditions were 102 rpm platen speed, 110 rpm carrier speed, 1.58 psi down force for copper and 7.6 kPa (1.1 psi) down force for tantalum, and 100 mL/min polishing composition flow.

Each of the polishing compositions contained 4 wt. % colloidal silica, 0.08 wt. % 1,8-AQDSA, and 500 ppm benzotriazole (BTA), and were adjusted to pH 2.2 with nitric acid. Polishing Composition 2A (comparative) did not contain a second metal polishing rate modifier agent. Polishing Compositions 2B and 2C (invention) contained 25 ppm and 100 ppm of potassium iodate, respectively.

The removal rates (RR) for copper and tantalum for each of the chemical-mechanical polishing compositions were determined, and the results are summarized in Table 2 as averages of multiple polishing experiments.

TABLE 2

Copper and Tantalum Removal Rates with 1,8-AQDSA and $KIO_3$

| Polishing Composition | $KIO_3$ (ppm) | $KIO_3$ (mM) | Ta RR (Å/min) | Cu RR (Å/min) |
|---|---|---|---|---|
| 2A (comparative) | 0 | 0.0 | 620 | 150 |
| 2B (invention) | 25 | 0.12 | 726 | 233 |
| 2C (invention) | 100 | 0.47 | 696 | 321 |

The results indicate that increasing the iodate concentration from 0 to about 0.5 mmol increased the copper removal rate in a linear fashion from about 150 to 325 Å/min. The Ta removal rate did not correlate to increasing $KIO_3$ concentrations at these levels, thereby indicating that the Cu removal rate can be tuned independently to the Ta removal rate.

Example 3

This example demonstrates the effectiveness of dual metal polishing rate modifier agents, using 1,8-AQDSA as a first metal polishing rate modifier agent ($1^{st}$ MPRM agent) with either potassium iodate or 2,5-dihydroxybenzoquinone as a second metal polishing rate modifier agent ($2^{nd}$ MPRM agent), in polishing substrates containing tantalum and copper.

Similar substrates comprising tantalum and copper were polished on a MIRRA™ polishing tool (Applied Materials) with a Polytex pad from Rodel with different polishing compositions (Polishing Compositions 3A-3C). The tool conditions included a 10.3 kPa (1.5 psi) down force.

Each of the polishing compositions contained 1 wt. % colloidal silica and 0.08 wt. % 1,8-AQDSA, and were adjusted to pH 2.8 with nitric acid. Polishing Composition 3A (comparative) further contained 0.05 wt. % BTA. Polishing Composition 3B (invention) contained 0.04 wt. % BTA and 2 mM 2,5-dihydroxybenzoquinone. Polishing Composition 3C (invention) contained 0.01 wt. % BTA and 0.01 wt. % (0.47 mM) potassium iodate.

The removal rates (RR) for copper and tantalum for each of the chemical-mechanical polishing compositions were determined, and the results are summarized in Table 3.

TABLE 3

Copper and Tantalum Removal Rates

| Polishing Composition | $2^{nd}$ MPRM Agent | Ta RR (Å/min) | Cu RR (Å/min) |
|---|---|---|---|
| 3A (comparative) | none | 532 | 25 |
| 3B (invention) | 2,5-dihydroxybenzoquinone | 435 | 55 |
| 3C (invention) | potassium iodate | 431 | 37 |

The results indicate that the slurries containing dual metal polishing rate modifier agents have increased Cu removal rates and slightly reduced Ta removal rates when compared to slurries with 1,8-AQDSA alone.

Example 4

This example demonstrates the effectiveness of dual metal polishing rate modifier agents, using 9,10-anthraquinone-1,5-disulfonic acid (1,5-AQDSA) as a first metal polishing rate modifier agent and potassium iodate as a second metal polishing rate modifier agent, in polishing substrates containing tantalum and copper.

Similar substrates comprising tantalum and copper were polished on a Logitech tabletop polisher with an IC1010 polishing pad (Rodel) with different polishing compositions (Polishing Compositions 4A-4D). The tool conditions were 102 rpm platen speed, 110 rpm carrier speed, 9.31 kPa (1.35 psi) down force, and 150 mL/min polishing composition flow.

Each of the polishing compositions contained 0.5 wt. % colloidal silica, 0.1 wt. % 1,5-AQDSA, 1000 ppm BTA, and the pH was adjusted to 2.4 using nitric acid. Polishing Composition 4A (comparative) did not contain a second metal polishing rate modifier agent. Polishing Compositions 4B, 4C, and 4D (invention) contained 125 ppm, 250 ppm, and 500 ppm of potassium iodate, respectively.

The removal rates (RR) for copper and tantalum for each of the chemical-mechanical polishing compositions were determined, and the results are summarized in Table 4.

TABLE 4

Copper and Tantalum Removal Rates with 1,5-AQDSA and KIO₃

| Polishing Composition | KIO₃ (ppm) | KIO₃ (mM) | Ta RR (Å/min) | Cu RR (Å/min) | Ta/Cu Rate Selectivity |
|---|---|---|---|---|---|
| 4A (comparative) | 0 | 0.0 | 186 | 65 | 2.9 |
| 4B (invention) | 125 | 0.58 | 457 | 160 | 2.9 |
| 4C (invention) | 250 | 1.17 | 641 | 152 | 4.2 |
| 4D (invention) | 500 | 2.34 | 1102 | 229 | 4.8 |

The results indicate that increasing iodate concentrations from 0 to about 500 ppm lead to increased copper removal rates in a linear fashion from about 65 to 229 Å/min ($R^2$=86%). Additionally, the Ta removal rate linearly increased with increasing concentrations of KIO₃ ($R^2$=99.7%), but with a much higher slope (1.8 for the Ta removal rate as compared to 0.3 for the Cu removal rate). Hence, with a polishing composition comprising these two metal polishing rate modifier agents, both the Cu removal rate and the Ta removal rate can be tuned simultaneously with different Ta to Cu selectivities being achieved.

Example 5

This example demonstrates the effectiveness of dual metal polishing rate modifier agents, using 1,8-AQDSA as a first metal polishing rate modifier agent and 1,2-naphthoquinone-4-sulfonic acid (NQSA) as a second metal polishing rate modifier agent, in polishing substrates containing tantalum and copper.

Similar substrates comprising tantalum and copper were polished on a Logitech tabletop polisher with a Politex polishing pad with different polishing compositions (Polishing Compositions 5A-5D). The tool conditions were 102 rpm platen speed, 110 rpm carrier speed, 9.31 kPa (1.35 psi) down force, and 150 mL/min polishing composition flow.

Each polishing composition contained 1 wt. % colloidal silica (50 nm particle size), 0.05 wt. % of the potassium salt of 1,8-AQDSA, and 1000 ppm BTA, and the pH was adjusted to 2.2 with nitric acid. Polishing Composition 5A (comparative) did not contain a second metal polishing rate modifier agent. Polishing Compositions 5B, 5C, and 5D (invention) contained 125 ppm, 250 ppm, and 500 ppm of NQSA, respectively.

The removal rates (RR) for copper and tantalum for each of the chemical-mechanical polishing compositions were determined, and the results are summarized in Table 5.

TABLE 5

Copper and Tantalum Removal Rates with 1,8-AQDSA and NQSA

| Polishing Composition | NQSA (ppm) | NQSA (mM) | Ta RR (Å/min) | Cu RR (Å/min) | Ta/Cu Rate Selectivity |
|---|---|---|---|---|---|
| 5A (comparative) | 0 | 0 | 669 | 36 | 17.6 |
| 5B (invention) | 125 | 0.48 | 745 | 53 | 14.1 |
| 5C (invention) | 250 | 0.96 | 814 | 221 | 3.7 |
| 5D (invention) | 500 | 1.92 | 802 | 721 | 1.1 |

The results indicate that increasing amounts of the second metal polishing rate modifier agent, NQSA, ranging from 0 to about 500 ppm, correlate with increased copper removal rates in a linear fashion. The removal rate for Ta does not correlate with increasing amounts of NQSA at the levels tested. Hence, by using a polishing composition comprising these two metal polishing rate modifier agents, the Cu removal rate can be tuned independently to that of Ta, achieving Ta to Cu selectivities ranging from about 18 to 1.

Example 6

This example demonstrates the effectiveness of dual metal polishing rate modifier agents, using 1,8-AQDSA as a first metal polishing rate modifier agent and varying amounts of 2,5-dihydroxy-1,4-benzoquinone (DHBQ) as the second metal polishing rate modifier agent, in polishing substrates containing tantalum and copper.

Similar patterned wafers from Semitech containing Cu (5000 Å), Ta (250 Å), and TEOS (5000 Å) that had been previously polished with a copper polishing composition to clear the copper, were polished with Polishing Compositions 6A-6D on a MIRRA™ polishing tool (Applied Materials) for 60 seconds.

Each of the polishing compositions contained 4 wt. % colloidal silica and 0.08 wt. % 1,8-AQDSA, and the pH adjusted to 2.2 using nitric acid. Polishing Composition 6A (comparative) did not contain a second metal polishing rate modifier agent. Polishing Compositions 6B, 6C, and 6D (invention) contained 50 ppm, 100 ppm, and 300 ppm of 2,5-dihydroxy-1,4-benzoquinone, respectively. In all polishing compositions tested, the conditions were sufficient to clear the Ta from the wafer.

The removal rates (RR) for copper and TEOS for each of the chemical-mechanical polishing compositions were determined, and the results are summarized in Table 6.

TABLE 6

Copper and TEOS Removal Rates with 1,8-AQDSA and DHBQ

| Polishing Composition | DHBQ (ppm) | Cu RR (Å/min) | TEOS RR (Å/min) |
|---|---|---|---|
| 6A (comparative) | 0 | 58 | 231 |
| 6B (invention) | 50 | 135 | 239 |
| 6C (invention) | 100 | 144 | 250 |
| 6D (invention) | 300 | 302 | 254 |

The results indicate that with the addition of the second metal polishing rate modifier agent, 2,5-dihydroxy-1,4-benzoquinone, to a polishing composition containing 1,8-AQDSA, the copper removal rates can by tuned in a large range. The results further indicate that the oxide rate does not change significantly.

Example 7

This example demonstrates the effectiveness of two metal polishing rate modifier agents, using 1,8-AQDSA as a first metal polishing rate modifier agent ($1^{st}$ MPRM agent) and ammonium persulfate (APS), potassium triiodide ($KI_3$), potassium permanganate ($KMnO_4$), or $I_2 \cdot malonamide_3$ as a second metal polishing rate modifier agent ($2^{nd}$ MPRM agent).

TEOS and copper blanket wafers were polished on a MIRRA™ polishing tool (Applied Materials) with a IC1010 polishing pad with different polishing compositions (Polishing Compositions 7A-7H). The tool conditions were 103 rpm platen speed, 97 rpm carrier speed, 10.3 kPa (1.5 psi) down force, and 200 mL/min polishing composition flow.

Each polishing composition contained 4 wt. % colloidal silica, 0.08 wt. % potassium salt of 1,8-AQDSA, and 500 ppm BTA, and the pH was adjusted to 2.2 with nitric acid. Polishing Composition 7A (comparative) did not contain a second metal polishing rate modifier agent. Polishing Compositions 7B and 7C (invention) contained 450 ppm and 2300 ppm of APS, respectively. Polishing Compositions 7D and 7E (invention) contained 600 ppm and 1000 ppm of $KMnO_4$, respectively. Polishing Compositions 7F and 7G (invention) contained 50 ppm and 150 ppm $KI_3$, respectively. The $KI_3$ was made by mixing an equal molar amount of KI and $I_2$ as a 1% concentrate in water prior to addition to the polishing composition. Polishing Composition 7H (invention) contained 50 ppm malonamide and 20 ppm $I_2$.

The removal rates (RR) for copper and TEOS for each of the chemical-mechanical polishing compositions were determined, and the results are summarized in Table 7.

TABLE 7

Copper and TEOS Removal Rates

| Polishing Composition | $2^{nd}$ MPRM Agent | Concentration (ppm) | Cu RR (Å/min) | TEOS RR (Å/min) |
|---|---|---|---|---|
| 7A (comparative) | none | — | 65 | 153 |
| 7B (invention) | APS | 450 | 80 | 230 |
| 7C (invention) | APS | 2300 | 343 | 343 |
| 7D (invention) | $KMnO_4$ | 600 | 888 | 174 |
| 7E (invention) | $KMnO_4$ | 1000 | 972 | 177 |
| 7F (invention) | $KI_3$ | 50 | 346 | 192 |
| 7G (invention) | $KI_3$ | 150 | 433 | 93 |
| 7H (invention) | $I_2 \cdot malonamide_3$ | 20($I_2$)/50 (malonamide) | 197 | — |

The results, shown in Table 7, indicate that the addition of the second metal polishing rate modifier agent increases the copper removal rate over the base polishing composition containing the 1,8-AQDSA alone. The results further indicate that the concentration of the second metal polishing rate modifier agent can be varied to tune the copper removal rate as well.

Example 8

This example demonstrates the effectiveness of dual metal polishing rate modifier agents in the presence of a halide ion.

Copper blanket wafers were polished on a MIRRA™ polishing tool (Applied Materials) with a IC1010 polishing pad with a polishing composition (Polishing Compositions 8A and 8B). The tool conditions were 103 rpm platen speed, 97 rpm carrier speed, 10.3 kPa (1.5 psi) down force, and 200 mL/min polishing composition flow.

Polishing Compositions 8A and 8B contained 4 wt. % colloidal silica, 500 ppm BTA, and 40 ppm potassium iodide, and the pH was adjusted to 2.2 with nitric acid.

Polishing Composition 8A further comprised 0.08 wt. % of the potassium salt of 1,8-AQDSA and 20 ppm $I_2$. The removal rate for copper was 128 Å/min. The use of halide anions as a second metal polishing rate modifier agent (such as iodide anions) in conjunction with a first metal polishing rate modifier agent (such as 1,8-AQDSA) can more effectively polish copper containing substrates as compared to the use of only one metal polishing rate modifier agent.

Similarly, Polishing Composition 8B contained 0.2 wt. % of 1,5-AQDSA and 500 ppm chloranilic acid. The removal rate for copper was 1009 Å/min.

Example 9

This example demonstrates the effectiveness of dual metal polishing rate modifier agents, using 1,8-AQDSA and iron (III) malonate [$Fe(III)(Ma)_3$], in polishing substrates containing tantalum and copper.

TEOS and copper blanket wafers were polished on a Logitech tabletop polisher with an IC1010 polishing pad with different polishing compositions (Polishing Compositions 9A-9E). The tool conditions were 100 rpm platen speed, 110 rpm carrier speed, 10.3 kPa (1.5 psi) down force, and 70 mL/min polishing composition flow.

Each polishing composition contained 4 wt. % colloidal silica, 800 ppm 1,8-AQDSA, and 500 ppm BTA, and the pH was adjusted to 2.2 with nitric acid. Polishing Composition 9A (comparative) did not contain a second metal polishing rate modifier agent. Polishing Compositions 9B-9E (invention) were prepared by adding various amounts of an aqueous solution containing 1:3 Fe(III) nitrate nonahydrate:malonic acid. Polishing Compositions 9B-9E contained 0.125 mM, 0.5 mM, 2.5 mM, and 10 mM Fe(III), respectively.

The removal rates (RR) for copper and TEOS for each of the chemical-mechanical polishing compositions were determined, and the results are summarized in Table 8.

TABLE 8

Copper and TEOS Removal Rates with 1,8-AQDSA and DHBQ

| Polishing Composition | Fe (III) (mM) | TEOS RR (Å/min) | Cu RR (Å/min) |
|---|---|---|---|
| 9A (comparative) | none | 214 | 59 |
| 9B (invention) | 0.125 | 271 | 85 |
| 9C (invention) | 0.5 | 311 | 122 |
| 9D (invention) | 2.5 | 453 | 187 |
| 9E (invention) | 10 | 422 | 247 |

The results indicate that the Fe(III) ion can be used as a second metal polishing rate modifier agent to increase the Cu removal rate and that the Cu removal rate can be tuned by varying the concentration Fe(III).

Example 10

This example demonstrates the synergistic effect of an organic oxidizer as a first metal polishing rate modifier agent and a halide (iodide) as a second metal polishing rate modifier agent when used in a polishing composition containing two metal polishing rate modifier agents.

TEOS and copper blanket wafers were polished on a Logitech tabletop polisher with different polishing compositions (Polishing Compositions 10A-10C).

Each of the polishing compositions contained 4 wt. % colloidal silica and 500 ppm BTA, and the pH was adjusted to 2.2 with nitric acid. Polishing Composition 10A did not contain any additives. Polishing Composition 10B (invention) contained 0.08 wt. % 1,8-AQDSA. Polishing Composition 10C (invention) contained 0.08 wt. % 1,8-AQDSA and 40 ppm potassium iodide.

The removal rates (RR) for copper for each of the chemical-mechanical polishing compositions were determined, and the results are summarized in Table 9.

TABLE 9

Copper Removal Rates

| Polishing Composition | 1,8-AQDSA (wt. %) | Halide (ppm) | Cu RR (Å/min) |
|---|---|---|---|
| 10A (comparative) | none | none | 100 |
| 10B (comparative) | 0.08 | none | 46 |
| 10C (invention) | 0.08 | 40 | 231 |

The results indicate that the addition of potassium iodide significantly increases the Cu removal rate when compared to a polishing composition containing 1,8-AQDSA alone. Additionally, the data indicate that iodide ion may be working as a catalyst of some kind with 1,8-AQDSA. Usually, 1,8-AQDSA does not oxidize copper. However, in the presence of very small amounts of iodide ion, significant copper removal rates are observed.

Example 11

This example demonstrates the effectiveness of a polishing composition containing two metal polishing rate modifier agents wherein 1,5-AQDSA is the first metal polishing rate modifier agent and a halide is the second metal polishing rate modifier agent; and of a polishing composition containing two metal polishing rate modifier agents and a halide ion as a third metal polishing rate modifier agent, wherein 1,5-AQDSA is the first metal polishing rate modifier agent, chloronilic acid is the second metal polishing rate modifier agent, and iodide, chloride, and bromide are the halide ions that represent the third metal polishing rate modifier agent, in polishing a substrate containing copper.

Copper blanket wafers were polished on a Logitech tabletop polisher with an EPIC™ D100 pad (Cabot Microelectronics, Aurora, Ill.) with different polishing compositions (Polishing Compositions 11A-11K). The tool conditions were 100 rpm platen speed, 110 rpm carrier speed, 10.3 kPa (1.5 psi) down force, and 80 mL/min polishing composition flow.

Each of the polishing compositions contained 4 wt. % colloidal silica, 0.2 wt. % 1,5-AQDSA, and 500 ppm BTA, and the pH was adjusted to 2.2 using ammonium hydroxide. The 1,5-AQDSA was prepared from the sodium salt (TCI America, Portland, Oreg.) and passed through an ion-exchange column packed with Purolite NRM-160, a sulfonated polystyrene resin (Purolite, Bala Cynwyd, Pa.). Polishing Composition 11A (comparative) did not contain any additives. Polishing Compositions 11B-11D (invention) contained 0.241 mM potassium iodide, potassium chloride, and potassium bromide, respectively. Polishing Compositions 11E and 11G (invention) contained 5 ppm KI with either 100 ppm or 400 ppm chloranilic acid, respectively. Polishing Composition 11F (invention) contained 13 ppm KI and 250 ppm chloranilic acid, respectively. Polishing Compositions 11H and 11I (invention) contained 20 ppm KI with either 100 ppm or 400 ppm of chloranilic acid, respectively. Polishing Compositions 11J and 11K (invention) contained 40 ppm KI with either 100 or 400 ppm of chloranilic acid, respectively.

The removal rates (RR) for copper for each of the chemical-mechanical polishing compositions were determined, and the results are summarized in Table 10.

TABLE 10

Copper Removal Rates

| Polishing Composition | Halide | Halide (ppm) | Chloranilic Acid (ppm) | Cu RR (Å/min) |
|---|---|---|---|---|
| 11A (comparative) | none | none | none | 34 |
| 11B (invention) | KI | 40 | none | 231 |
| 11C (invention) | KCl | 18 | none | 91 |
| 11D (invention) | KBr | 29 | none | 71 |
| 11E (invention) | KI | 5 | 100 | 334 |
| 11F (invention) | KI | 13 | 250 | 602 |
| 11G (invention) | KI | 5 | 400 | 246 |
| 11H (invention) | KI | 20 | 100 | 326 |
| 11I (invention) | KI | 20 | 400 | 678 |
| 11J (invention) | KI | 40 | 100 | 519 |
| 11K (invention) | KI | 40 | 400 | 848 |

The results show that KI, KCl, and KBr increase the Cu removal rates over the base polishing composition: Furthermore, the addition of chloranilic acid and KI allows even higher removal rates, and a large range of Cu removal rates can be achieve by varying the amounts of KI and chloranilic acid.

Example 12

This example demonstrates the effectiveness of two metal polishing rate modifier agents and a halide as a third metal polishing rate modifier agent, using 1,5-AQDSA as the first metal polishing rate modifier agent, $I_2$ as the second metal polishing rate modifier agent, and potassium iodide as the third polishing rate modifier agent, in polishing substrates containing copper.

The polishing conditions were as described in Example 11. Each of the polishing compositions 4 wt. % silica and 500 ppm BTA, and the pH was adjusted to 2.2 with nitric acid. Polishing Composition 12A (comparative) contained 800 ppm of 1,5-AQDSA. Polishing Composition 12B (comparative) contained 40 ppm KI. Polishing Composition 12C (comparative) contained 20 ppm $I_2$. Polishing Composition 12D (comparative) contained 800 ppm 1,5-AQDSA. Polishing Composition 12E (invention) contained 40 ppm KI and 20 ppm $I_2$. Polishing Composition 12F (invention) contained 800 ppm 1,5-AQDSA and 40 ppm KI. Polishing Composition 12G (invention) contained 800 ppm 1,5-AQDSA and 20 ppm $I_2$. Polishing Composition 12H (invention) contained 800 ppm 1,5-AQDSA, 20 ppm $I_2$, and 40 ppm KI.

The removal rates (RR) for copper for each of the chemical-mechanical polishing compositions were determined, and the results are summarized in Table 11.

TABLE 11

Copper Removal Rates

| Polishing Composition | 1,5-AQDSA (ppm) | KI (ppm) | $I_2$ (ppm) | Cu RR (Å/min) |
|---|---|---|---|---|
| 12A (comparative) | none | none | none | 124 |
| 12B (comparative) | none | 40 | none | 130 |

TABLE 11-continued

Copper Removal Rates

| Polishing Composition | 1,5-AQDSA (ppm) | KI (ppm) | $I_2$ (ppm) | Cu RR (Å/min) |
|---|---|---|---|---|
| 12C (comparative) | none | none | 20 | 137 |
| 12D (comparative) | 800 | none | none | 94 |
| 12E (comparative) | none | 40 | 20 | 150 |
| 12F (invention) | 800 | 40 | none | 261 |
| 12G (invention) | 800 | none | 20 | 239 |
| 12H (invention) | 800 | 40 | 20 | 287 |

The results indicate that there is a synergistic effect of combining KI and another metal polishing rate modifier agent. For example, the polishing rate for KI as the sole metal polishing rate modifier agent showed very low removal rates (average 130 Å/min). The rate for 1,5-AQDSA as the sole metal polishing rate modifier agent also showed very low removal rates (average of 94 Å/min). But the rate for KI in combination with 1,5-AQDSA gave a greater than additive response for the removal rate (average of 261 Å/min). The results also indicate that there is an increase in the Cu removal rate when $I_2$ is added as a metal polishing rate modifier agent. However, at the low concentrations used in this experiment, the removal rate enhancement is very low. Only when $I_2$ was used in combination with KI were the removal rates significantly enhanced.

Example 13

This example further demonstrates the effectiveness of a first metal polishing rate modifier ($1^{st}$ MPRM) agent and a halide as a second metal polishing rate modifier ($2^{nd}$ MPRM) agent in polishing substrates containing tantalum and copper.

Similar substrates comprising tantalum and copper and TEOS were polished under the polishing conditions described in Example 11 with Polishing Compositions 13A-13H. Each of the polishing compositions contained 4 wt. % silica and 500 ppm BTA, and the pH was adjusted to 2.2 with nitric acid. Polishing Composition 13A (comparative) contained 0.2 wt. % 1,5-AQDSA. Polishing Compositions 13B-13D contained 0.1 wt. % 9,10-anthraquinone-2,6-disulfonic acid (2,6-AQDSA) and 20 ppm, 40 ppm, and 100 ppm KI, respectively. Polishing Composition 13E contained 0.15 wt. % 2,6-AQDSA and 60 ppm KI. Polishing Compositions 13F and 13G contained 0.2 wt. % 2,6-AQDSA and 40 ppm KI and 100 ppm KI, respectively. Polishing Composition 13H contained 0.2 wt. % 1,5-AQDSA and 40 ppm KI.

The removal rates (RR) for copper, tantalum, and TEOS for each of the chemical-mechanical polishing compositions were determined, and the results are summarized in Table 12.

TABLE 12

Copper, Tantalum, and TEOS Removal Rates

| Polishing Composition | $1^{st}$ MPRM Agent | Halide | TEOS RR (Å/min) | Cu RR (Å/min) | Ta RR (Å/min) |
|---|---|---|---|---|---|
| 13A (comparative) | 0.2 wt. % 1,5-AQDSA | none | 208 | 291 | 1039 |
| 13B (invention) | 0.1 wt. % 2,6-AQDSA | 20 ppm KI | 145 | 393 | — |
| 13C (invention) | 0.1 wt. % 2,6-AQDSA | 40 ppm KI | 220 | 720 | — |
| 13D (invention) | 0.1 wt. % 2,6-AQDSA | 100 ppm KI | 229 | 631 | — |
| 13E (invention) | 0.1 wt. % 2,6-AQDSA | 60 ppm KI | 313 | 551 | 709 |
| 13F (invention) | 0.15 wt. % 2,6-AQDSA | 40 ppm KI | 257 | 664 | 771 |
| 13G (invention) | 0.2 wt. % 2,6-AQDSA | 100 ppm KI | 252 | 281 | 1051 |
| 13H (invention) | 0.2 wt. % 1,5-AQDSA | 40 ppm KI | 228 | 402 | — |

The results further indicate an advantage of using a halide as a metal polishing rate modifier agent in conjunction with 2,6-AQDSA as a metal polishing rate modifier agent for the removal rate of Cu and Ta. The data indicate that the composition of the invention allows for the independent variation of Cu removal rates versus the Ta or TEOS removal rates.

Example 14

This example further demonstrates the effectiveness of dual metal polishing rate modifier (MPRM) agents on pattern wafer polishing.

Blanket TEOS and copper wafers and patterned wafers were polished with Polishing Compositions 14A-14Q. Polishing was conducted on the Logitech tool with the same conditions as used in Example 11. Each wafer type was polished with the various compositions for 60 seconds.

Each of the polishing compositions contained 4 wt. % colloidal silica, 800 ppm 1,8-AQDSA, 150 ppm BTA, and 14 ppm Kathon, and the pH was adjusted to 2.2 with nitric acid. Polishing Composition 14A (comparative) did not contain any additional additives. Polishing Compositions 14B-14E (invention) contained 0.125 mM, 0.5 mM, 2.5 mM, and 10 mM of $KIO_3$, respectively. Polishing Compositions 14F-14I (invention) contained 0.125 mM, 0.5 mM, 2.5 mM, and 10 mM of NQSA, respectively. Polishing Compositions 14J-M (invention) contained 0.125 mM, 0.5 mM, 2.5 mM, and 10 mM of $K_2S_2O_8$, respectively. Polishing Compositions 14N-14Q (invention) contained 0.125 mM, 0.5 mM, 2.5 mM, and 10 mM of $Fe(Ma)_3$, respectively.

The removal rates (RR) for copper and TEOS for each of the chemical-mechanical polishing compositions were determined, and the results are summarized in Table 13. In addition, the field-array oxide loss was determined, and the ratio Cu RR and field-array oxide loss was calculated.

TABLE 13

TEOS and Cu Removal Rates

| Polishing Composition | $2^{nd}$ MPRM Agent | TEOS RR (Å/min) | Cu RR (Å/min) | Field-Array Oxide Loss (5 μm) | Ratio of Cu RR:Field Array Oxide Loss |
|---|---|---|---|---|---|
| 14A (comparative) | none | 214 | 59 | 166 | 0.3554 |

TABLE 13-continued

TEOS and Cu Removal Rates

| Polishing Composition | 2$^{nd}$ MPRM Agent | TEOS RR (Å/min) | Cu RR (Å/min) | Field-Array Oxide Loss (5 μm) | Ratio of Cu RR:Field Array Oxide Loss |
|---|---|---|---|---|---|
| 14B (invention) | 0.125 mM KIO$_3$ | 208 | 12 | 156 | 0.0769 |
| 14C (invention) | 0.5 mM KIO$_3$ | 237 | 79 | 90 | 0.8778 |
| 14D (invention) | 2.5 mM KIO$_3$ | 244 | 1366 | 237 | 5.7637 |
| 14E (invention) | 10 mM KIO$_3$ | 259 | 1906 | 296 | 6.4392 |
| 14F (invention) | 0.125 mM NQSA | 230 | 85 | 192 | 0.4427 |
| 14G (invention) | 0.5 mM NQSA | 255 | 392 | 158 | 2.4810 |
| 14H (invention) | 2.5 mM NQSA | 258 | 1326 | 506 | 3.0158 |
| 14I (invention) | 10 mM NQSA | 297 | 2843 | 458 | 6.2074 |
| 14J (invention) | 0.125 mM K$_2$S$_2$O$_8$ | 262 | 83 | 275 | 0.3018 |
| 14K (invention) | 0.5 mM K$_2$S$_2$O$_8$ | 298 | 102 | 254 | 0.4016 |
| 14L (invention) | 2.5 mM K$_2$S$_2$O$_8$ | 308 | 141 | 498 | 0.2831 |
| 14M (invention) | 10 mM K$_2$S$_2$O$_8$ | 1690 | 350 | 641 | 0.5460 |
| 14N (invention) | 0.125 mM Fe(Ma)$_3$ | 271 | 85 | 211 | 0.4028 |
| 14O (invention) | 0.5 mM Fe(Ma)$_3$ | 311 | 122 | 448 | 0.2723 |
| 14P (invention) | 2.5 mM Fe(Ma)$_3$ | 453 | 187 | 599 | 0.3122 |
| 14Q (invention) | 10 mM Fe(Ma)$_3$ | 422 | 247 | 763 | 0.3237 |

It is desirable to polish pattern wafers so that the difference between the field oxide loss and array oxide loss is small. This desired result is often difficult when polishing compositions are formulated to have high copper removal rate. Frequently it is observed that the higher the copper removal rate, the higher the field-array oxide loss.

The results in Table 13 indicate that NQSA (1,4-naphthoquinone sulfonic acid) and potassium iodate provide superior results to potassium persulfate and Fe(Ma)$_3$ (iron malonate) when used as metal polishing rate modifier agents. High ratios of Cu removal rate to the field-array oxide loss are desirable. Thus, under the above described conditions it is preferable for one of the metal polishing rate modifier agents to be selected from organic quinones and inorganic main group oxidizers, and not of the per- or transition metal-type oxidizers.

Example 15

This example demonstrates the usefulness of the CMP composition of the invention in reducing defectivities when polishing substrates containing barrier materials with hard pads.

Two TEOS blanket wafers were polished on a MIRRA™ polishing tool (Applied Materials) for 60 seconds with an EPIC™ D100 pad (Cabot Microelectronics, Aurora, Ill.) (i.e., a hard pad) and a Politex pad (i.e., a soft pad) with different polishing compositions (Polishing Compositions 15A-15C). The tool conditions were 103 rpm platen speed, 97 rpm carrier speed, 10.3 kPa (1.5 psi) down force, and 200 mL/min polishing composition flow.

Polishing Composition 15A (comparative) contained 4 wt. % silica, 500 ppm BTA, and 800 ppm of 1,5-AQDSA, and the pH was adjusted to 2.2 with nitric acid. Polishing Composition 15B (invention) contained 4 wt. % silica, 500 ppm BTA, 800 ppm of 1,5-AQDSA, 17 ppm I$_2$, and 34 ppm KI, and the pH was adjusted to 2.2 with nitric acid. Polishing Composition 15C (comparative) was a commercial hydrogen peroxide-based polishing composition having high solids content and high pH (i-Cue™ 6678-A 12, Cabot Microelectronics Corporation).

The wafers were inspected for defects using an SPI KLA-Tencor (KLA-Tencor, Inc., San Jose, Calif.) dark field blanket wafer inspection tool. The output is a normal and oblique measurement count that is a measure of defectivity; higher defects correlate to higher normal and oblique measurement counts. The average normal and oblique counts are reported for each of the two wafers polished per experiment in Table 14.

TABLE 14

Defectivity Values with Soft and Hard Pads

| Polishing Composition | Pad | Normal Count | Oblique Count |
|---|---|---|---|
| 15A (comparative) | Politex (soft) | 2618 | 5498 |
| 15B (invention) | Politex (soft) | 2933 | 5346 |
| 15C (comparative) | Politex (soft) | 10497 | 9336 |
| 15A (comparative) | D100 (hard) | 18491 | 23500 |
| 15B (invention) | D100 (hard) | 20143 | 36872 |

The results indicate that the polishing composition of the invention exhibits a low number of defects compared with the hydrogen peroxide-based polishing composition on the soft pad. The defectivity on the hard pad is higher, as expected, but surprisingly, still within an acceptable range.

Example 16

This example further demonstrates the effectiveness of dual metal polishing rate modifier (MPRM) agents on pattern wafer polishing.

Similar substrates comprising thin films of Cu, Ta, or TiN on silicon were polished one Logitech tabletop polisher with a EPIC™ D100 pad (Cabot Microelectronics, Aurora, Ill.) with different polishing compositions (Polishing Compositions 16AA-16BG). The tool conditions were 102 rpm platen speed, 110 rpm carrier speed, 10.3 kPa (1.5 psi) down force, and 100 mL/min polishing composition flow.

Each of the polishing compositions contains 4 wt. % colloidal silica (Nalco 50 nm diameter) and 500 ppm of BTA. Polishing compositions of the invention contained 5.4 mM 1,5-AQDSA as the first metal polishing rate modifier agent and a second metal polishing rate modifier agent as set out in Table 15, and the pH was adjusted to 2.8 with ammonium hydroxide. Comparative polishing compositions that do not contain a first metal polishing rate modifier agent were adjusted to a pH of 2.8 with nitric acid.

The removal rates (RR) for copper, tantalum, and TiN for each of the chemical-mechanical polishing compositions were determined, and the results are summarized in Table 15.

TABLE 15

Copper, TiN, and Tantalum Removal Rates

| Polishing Composition | $1^{st}$ MPRM Agent | $2^{nd}$ MPRM Agent | Cu RR (Å/min) | TiN RR (Å/min) | Ta RR (Å/min) |
|---|---|---|---|---|---|
| 15AA (comparative) | 1,5-AQDSA | none | 47 | 130 | 593 |
| 15AB (comparative) | none | none | 16 | 89 | 6 |
| 15AC (comparative) | none | 0.9 mM $I_2$•malonamide$_3$ | 256 | 287 | 836 |
| 15AD (invention) | 1,5-AQDSA | 0.9 mM $I_2$•malonamide$_3$ | 467 | 128 | 1285 |
| 15AE (comparative) | none | 1.85 mM $K_2S_2O_8$ | 998 | 745 | 398 |
| 15AF (invention) | 1,5-AQDSA | 1.85 mM $K_2S_2O_8$ | 157 | 608 | 520 |
| 15AG (comparative) | none | 0.9 mM $K_2S_2O_8$ | 755 | 679 | 517 |
| 15AH (invention) | 1,5-AQDSA | 0.9 mM $K_2S_2O_8$ | 169 | 643 | 591 |
| 15AI (comparative) | none | 1.85 mM $H_2O_2$ | 155 | 515 | 583 |
| 15AJ (invention) | 1,5-AQDSA | 1.85 mM $H_2O_2$ | 167 | 256 | 688 |
| 15AK (comparative) | none | 1.85 mM $H_2O_2$ | 143 | 791 | 610 |
| 15AL (invention) | 1,5-AQDSA | 1.85 mM $H_2O_2$ | 196 | 311 | 420 |
| 15AM (comparative) | none | 185 mM $H_2O_2$ | 299 | 992 | 740 |
| 15AN (invention) | 1,5-AQDSA | 185 mM $H_2O_2$ | 315 | 478 | 363 |
| 15AO (comparative) | none | 1.85 nM $KIO_3$ | 459 | 647 | 722 |
| 15AP (invention) | 1,5-AQDSA | 1.85 nM $KIO_3$ | 139 | 657 | 441 |
| 15AQ (comparative) | none | 1.85 nM Oxone | 1660 | 341 | 424 |
| 15AR (invention) | 1,5-AQDSA | 1.85 nM Oxone | 383 | 424 | 558 |
| 15AS (invention) | 1,5-AQDSA | 1.85 mN $I_2$•malonamide$_3$ | 853 | 161 | 500 |
| 15AT (comparative) | none | 1.85 mN Chloranilic acid | 139 | 122 | 492 |
| 15AU (invention) | 1,5-AQDSA | 1.85 mN Chloranilic acid | 209 | 85 | 633 |
| 15AV (comparative) | none | 1.85 nM Fe(NO$_3$)$_3$ | 86 | 82 | 18 |
| 15AW (invention) | 1,5-AQDSA | 1.85 nM Fe(NO$_3$)$_3$ | 285 | 141 | 69 |
| 15AX (comparative) | none | 1.85 nM $KClO_3$ | 76 | 213 | 613 |
| 15AY (invention) | 1,5-AQDSA | 1.85 nM $KClO_3$ | 102 | 140 | 573 |
| 15AZ (comparative) | none | 1.85 nM t-BuOOH | 84 | 161 | 475 |
| 15BA (invention) | 1,5-AQDSA | 1.85 nM t-BuOOH | 58 | 140 | 529 |
| 15BB (comparative) | none | 1.85 nM $KBrO_3$ | 227 | 730 | 571 |

TABLE 15-continued

Copper, TiN, and Tantalum Removal Rates

| Polishing Composition | 1st MPRM Agent | 2nd MPRM Agent | Cu RR (Å/min) | TiN RR (Å/min) | Ta RR (Å/min) |
|---|---|---|---|---|---|
| 15BC (invention) | 1,5-AQDSA | 1.85 nM KBrO$_3$ | 185 | 152 | 533 |
| 15BD (comparative) | none | 1.85 nM NMO | 28 | 140 | 18 |
| 15BE (invention) | 1,5-AQDSA | 1.85 nM NMO | 37 | 211 | 221 |
| 15BF (comparative) | none | 1.85 Ce(IV)(SO$_4$)$_4$ | 49 | 40 | 43 |
| 15BG (invention) | 1,5-AQDSA | 1.85 Ce(IV)(SO$_4$)$_4$ | 42 | 182 | 231 |

The results demonstrate that, when no metal polishing rate modifier is present, as in Polishing Composition AB, the polishing rates for Ta, Cu, and TiN are very low. When one metal polishing rate modifier agent is present, i.e., 1,5-AQDSA as in Polishing Composition AA, effective polishing rates for Ta are observed, but the polishing rates for Cu and TiN are low. In order to obtain acceptable rates on these two diverse materials, a combination of metal polishing rate modifier agents is required. Moreover, by carefully choosing the metal polishing rate modifier agents and their respective concentrations, the desired rates for Ta, Cu, and TiN can be selected and tuned.

Metal polishing rate modifier agents useful for polishing TiN include AQDSA, H$_2$O$_2$, iodate, oxone, I$_2$.malonamide, chloranilic acid, perchlorate, t-BuOOH, and bromate. Metal polishing rate modifier agents useful for polishing copper include I$_2$.malonamide$_3$, persulfate, iodate, oxone, chloranilic acid, and bromate.

Preferred combinations for polishing compositions requiring tunable Ta, Cu, and TiN removal rates include AQDSA and I$_2$.malonamide$_3$, iodate, oxone, perchlorate, bromate, and n-methylmorpholine-N-oxide.

Example 17

This example demonstrates the effectiveness of dual metal polishing rate modifier agents 1,5-AQDSA and I$_2$.malonamide$_3$ in the presence of a second oxidizing agent.

The polishing conditions were the same as Example 16. Polishing Composition 16 contained 4 wt. % colloidal silica, 500 ppm BTA, 5.4 mM 1,5-AQDSA, 0.9 mM I$_2$.malonamide$_3$, and 185 mM H$_2$O$_2$.

The removal rates were 486 Å/min for copper, 775 Å/min for TiN, and 58 Å/min for Ta. Therefore, the presence of another metal polishing rate modifier agent in addition to 1,5-AQDSA and I$_2$.malonamide$_3$ significantly increases the polishing rate for the barrier layer TiN.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) an abrasive,
   (b) a first metal polishing rate modifier agent having a standard reduction potential less than 0.34 V relative to a standard hydrogen electrode, wherein the first metal polishing rate modifier agent is an anthraquinone selected from the group consisting of 9,10-anthraquinone-1,8-disulfonic acid, 9,10-anthraquinone-1,5-disulfonic acid, 9,10-anthraquinone-2,6-disulfonic acid, and salts thereof,
   (c) a second metal polishing rate modifier agent having a standard reduction potential greater than 0.34 V relative to a standard hydrogen electrode, and
   (d) a liquid carrier.

2. The chemical-mechanical polishing composition of claim 1, wherein the second agent is an organic agent.

3. The chemical-mechanical polishing composition of claim 2, wherein the second agent is selected from the group consisting of dihydroxybenzoquinones, naphthoquinones, chloranilic acid, and dichloroindophenol.

4. The chemical-mechanical polishing composition of claim 2, wherein the second agent is selected from the group consisting of n-methylmorpholine-N-oxide and t-butyl peroxide.

5. The chemical-mechanical polishing composition of claim 1, wherein the second agent is an inorganic agent.

6. The chemical-mechanical polishing composition of claim 5, wherein the second agent is selected from the group consisting of hydrogen peroxide, iodate salts, persulfate salts, permanganate salts, $I_2$, inorganic salts of iron (III), organic salts of iron (III), and potassium peroxymonosulfate.

7. The chemical-mechanical polishing composition of claim 5, wherein the second agent is selected from the group consisting of perchlorate salts, bromate salts, and cerium (IV) sulfate.

8. The chemical-mechanical polishing composition of claim 1, wherein the composition further comprises a halide selected from the group consisting of chloride and bromide.

9. The chemical-mechanical polishing composition of claim 1, wherein the composition further comprises iodide.

10. A chemical-mechanical polishing composition comprising:
(a) an abrasive,
(b) a first metal polishing rate modifier agent, wherein the first agent is an anthraquinone with one or more functional groups, wherein the anthraquinone is selected from the group consisting of 9,10-anthraquinone-1,8-disulfonic acid, 9,10-anthraquinone-1,5-disulfonic acid, 9,10-anthraquinone-2,6-disulfonic acid, and salts thereof,
(c) a second metal polishing rate modifier agent, wherein the second agent is selected from the group consisting of iodide, iodine, $I_2$.malonamide$_3$, and triiodide, and
(d) a liquid carrier.

11. The chemical-mechanical polishing composition of claim 10, wherein the second agent is $I_2$.malonamide$_3$.

12. The chemical-mechanical polishing composition of claim 10, wherein the second agent is iodide.

13. The chemical-mechanical polishing composition of claim 10, wherein the composition further comprises an oxidizing agent selected from the group consisting of hydrogen peroxide, iodate salts, persulfate salts, permanganate salts, bromate salts, potassium peroxymonosulfate, chloranilic acid, and n-methylmorpholine-N-oxide.

14. A chemical-mechanical polishing composition comprising:
(a) an abrasive,
(b) a first metal polishing rate modifier agent, wherein the first agent is an anthraquinone with one or more functional groups, wherein the anthraquinone is selected from the group consisting of 9,10-anthraquinone-1,8-disulfonic acid, 9,10-anthraquinone-1,5-disulfonic acid, 9,10-anthraquinone-2,6-disulfonic acid, and salts thereof,
(c) a second metal polishing rate modifier agent, wherein the second agent is an oxidizing agent present in a concentration below the concentration of the first agent, and
(d) a liquid carrier.

15. The chemical-mechanical polishing composition of claim 14, wherein the first agent is present in a concentration of about 1 to about 60 mmol.

16. The chemical-mechanical polishing composition of claim 15, wherein the first agent is present in a concentration of about 1 to about 10 mmol.

17. The chemical-mechanical polishing composition of claim 14, wherein the second agent is an organic agent.

18. The chemical-mechanical polishing composition of claim 17, wherein the second agent is selected from the group consisting of dihydroxybenzoquinones, naphthoquinones, chloranilic acid, and dichloroindophenol, and $I_2$.malonamide$_3$.

19. The chemical-mechanical polishing composition of claim 17, wherein the second agent is selected from the group consisting of n-methylmorpholine-N-oxide and t-butyl peroxide.

20. The chemical-mechanical polishing composition of claim 18, wherein the second agent is $I_2$.malonamide$_3$.

21. The chemical-mechanical polishing composition of claim 14, wherein the second agent is an inorganic agent.

22. The chemical-mechanical polishing composition of claim 21, wherein the second agent is selected from the group consisting of hydrogen peroxide, iodate salts, persulfate salts, permanganate salts, $I_2$, inorganic salts of iron (III), organic salts of iron (III), and potassium peroxymonosulfate.

23. The chemical-mechanical polishing composition of claim 21, wherein the second agent is selected from the group consisting of perchlorate salts, bromate salts, and cerium (IV) sulfate.

24. The chemical-mechanical polishing composition of claim 14, wherein the composition further comprises a halide selected from the group consisting of chloride and bromide.

25. The chemical-mechanical polishing composition of claim 14, wherein the composition further comprises iodide.

* * * * *